United States Patent [19]

Iwatani

[11] Patent Number: 4,523,215

[45] Date of Patent: Jun. 11, 1985

[54] SEMICONDUCTOR DEVICE

[75] Inventor: Shiro Iwatani, Himeji, Japan

[73] Assignee: Mitsubishi Denki Kabushiki Kaisha, Tokyo, Japan

[21] Appl. No.: 227,784

[22] Filed: Jan. 21, 1981

[30] Foreign Application Priority Data

Jan. 21, 1980 [JP] Japan ................... 55-6558

[51] Int. Cl.³ ................ H01L 27/02; H01L 27/04; H01L 29/72
[52] U.S. Cl. ................................. 357/40; 357/34; 357/46; 357/48; 357/89; 357/90
[58] Field of Search .............. 357/48, 40, 89, 90, 357/34, 46

[56] References Cited

U.S. PATENT DOCUMENTS

| | | | |
|---|---|---|---|
| 3,335,341 | 8/1967 | Lin | 357/48 |
| 3,547,716 | 12/1970 | De Witt et al. | 357/48 |
| 3,595,713 | 7/1971 | DeBrebisson et al. | 357/48 |
| 3,868,722 | 2/1975 | Le Can et al. | 357/46 |
| 4,228,448 | 10/1980 | Lalumia et al. | 357/48 |

Primary Examiner—Andrew J. James
Assistant Examiner—Jerome Jackson, Jr.
Attorney, Agent, or Firm—Wenderoth, Lind & Ponack

[57] ABSTRACT

A semiconductor device including a power transistor and a power semiconductor diode disposed on a common semiconductor substrate is arranged such that the power diode has a withstanding voltage and a dielectric strength which are greater than that of the power transistor. The increased withstanding voltage and dielectric strength of the power semiconductor diode are effected without deteriorating the characteristics of the power transistor.

1 Claim, 2 Drawing Figures

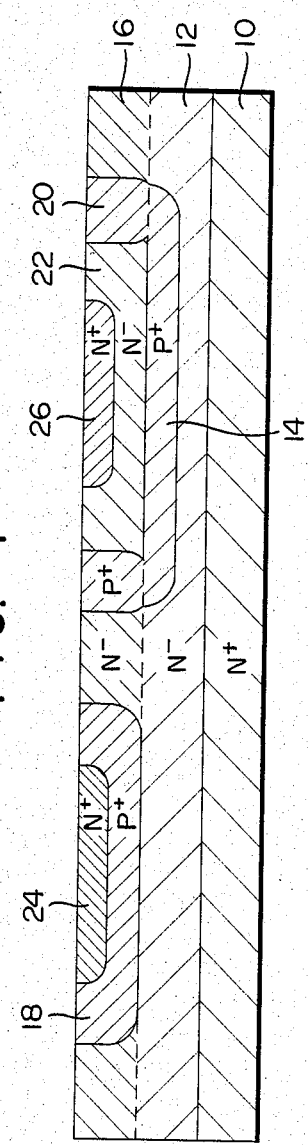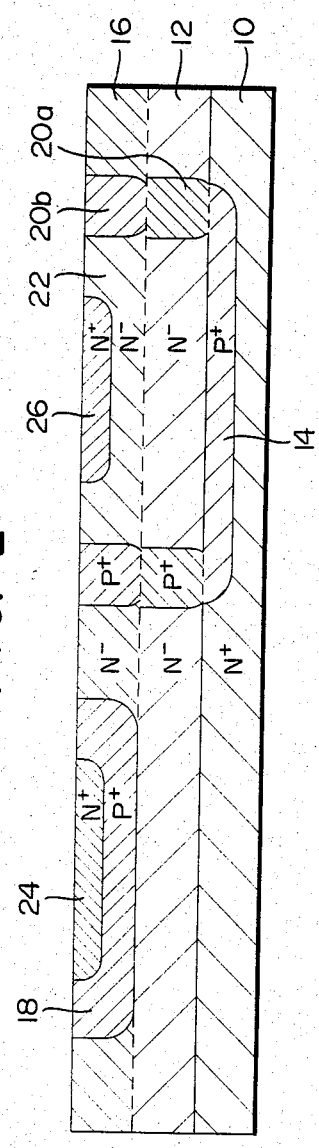

SEMICONDUCTOR DEVICE

BACKGROUND OF THE INVENTION

This invention relates to a semiconductor device comprising a power transistor and a power semiconductor diode disposed on a common semiconductor substrate.

A conventional semiconductor device of the type referred to has comprised an N+ type semiconductor substrate serving as a collector layer of a power transistor, a first N− type semiconductor layer and a second N− type semiconductor layer superposed on one another in the named order. Then, a P+ type buried anode layer has been disposed on a predetermined portion of the surface of the first semiconductor layer contacting the second semiconductor layer and a P+ type anode wall has extended from a peripheral portion of the P+ type buried anode layer and reached the surface of the second semiconductor layer. Then, an N+ type cathode layer has been selectively disposed on the surface of that portion of the second semiconductor layer encircled with the anode wall resulting in the completion of a power semiconductor diode.

On the other hand, the power transistor has been produced by extending a P+ type base layer throughout the thickness of the second semiconductor layer on that portion spaced from the anode wall and then selectively disposing an N+ type emitter layer on the surface of the base layer.

In conventional semiconductor devices such as described above, the power diode has been low in both its withstanding voltage and dielectric strength because that portion of the second N− type semiconductor layer disposed between the cathode layer and the buried anode layer or its N− type cathode layer is thin, resulting in the punch-through effect occurring easily. In order to increase the punch-through voltage, the thickness of the second semiconductor layer might be increased. This has caused an increase in crystal defects therein, resulting in the deterioration of the characteristics of the power transistor and diode. Also, this increase in thickness has resulted in the power transistor having a collector body resistance which is increased beyond its required magnitude which causes a deterioration in the characteristics thereof.

Accordingly, it is an object of the present invention to provide a new and improved semiconductor device having a power diode with both an increased withstanding voltage and an increased dielectric strength, the power semiconductor diode being disposed on the same semiconductor substrate as a power transistor without deteriorating the characteristics of the power transistor.

SUMMARY OF THE INVENTION

The present invention provides a semiconductor device comprising a low resistivity semiconductor substrate of a first type of conductivity, a first high resistivity semiconductor layer of the first type of conductivity disposed on the entire surface of the semiconductor substrate, a buried low resistivity anode layer of a second type of conductivity disposed on a predetermined portion of a boundary between the semiconductor substrate and the first high resistivity semiconductor layer, a first anode wall in the form of an annulus extending through the first high resistivity semiconductor layer from the surface thereof remote from the semiconductor substrate and reaching a peripheral portion of the buried anode layer, said first anode wall having the second type of conductivity and a low resistivity, a second high resistivity semiconductor layer of the first type conductivity disposed on the entire surface of the first high resistivity semiconductor layer including the first anode wall, a second anode wall in the form of an annulus extending through the second high resistivity semiconductor layer from the surface thereof remote from the first high resistivity semiconductor layer and reaching the first anode wall, the second anode wall having the second type of conductivity and a low resistivity, a low resistivity base layer of the second type of conductivity selectively disposed on the exposed surface of the second high resistivity semiconductor layer and reaching the first high resistivity semiconductor layer at a position located outside of the annulus of the second anode wall on the second high resistivity semiconductor layer to be spaced therefrom, a low resistivity cathode layer of the first type of conductivity selectively disposed on the exposed surface of a portion of the second high resistivity semiconductor layer encircled with the second anode wall, and a low resistivity emitter layer of the first type of conductivity selectively disposed on the surface of the base layer, the arrangement being such that a power transistor is formed of the emitter layer as an emitter, the base layer as a base and both a portion of the first high resistivity semiconductor layer located directly under the base layer and the semiconductor substrate as a collector, and such that a power semiconductor diode is formed of the buried anode layer and the first and second anode walls forming an anode, and the low resistivity cathode layer and portions of the first and second high resistivity layers which are respectively encircled by the first and second anode walls forming a cathode.

BRIEF DESCRIPTION OF THE DRAWING

The present invention will become more readily apparent from the following detailed description taken in conjunction with the accompanying drawing in which:

FIG. 1 is a fragmental longitudinal sectional view of a conventional semiconductor device comprising a power transistor and a power semiconductor diode disposed on a common semiconductor substrate; and FIG. 2 is a fragmental longitudinal sectional view of a semiconductor device including a power transistor and a power semiconductor diode disposed on a common semiconductor substrate in accordance with the present invention.

DESCRIPTION OF THE PREFERRED EMBODIMENTS

Referring now to FIG. 1 of the drawings, there is illustrated a conventional semiconductor device comprising a power transistor and a power semiconductor diode disposed on a common semiconductor substrate. The illustrated arrangement comprises an N+ type semiconductor substrate 10 which is low in resistivity, a first N− type high resistivity semiconductor layer 12 which is disposed on the entire surface of the semiconductor substrate 10, and a P+ type buried anode layer 14 which is disposed on a predetermined portion of the surface of the first N− type high resistivity semiconductor layer 12. Then, disposed on the entire surface of the first N− type high resistivity semiconductor layer 12 including the P+ type buried anode layer 14 is a second N− type high resistivity semiconductor layer 16 which is thinner than the first N− type high resistivity semiconductor layer 12.

Subsequently, a P+ type base layer 18 is disposed in a portion of the second N− type high resistivity semiconductor layer 16 spaced from that portion thereof underlaid with the P+ type buried anode layer 14 so as to extend through the entire thickness thereof while a P+ type anode wall 20 is disposed to extend throughout the thickness of the second N− type high resistivity semiconductor layer 16 and reach the peripheral portion of the P+ type buried anode layer 14 so as to define a diode portion 22 in the second N− type high resistivity semiconductor layer 16. Following this, an N+ type emitter layer 24 is selectively disposed on the surface of the P+ type base layer 18 and an N+ type cathode layer 26 is selectively disposed on the surface of the diode portion 22 of the second N− type high resistivity semiconductor layer 16.

Thus, a power transistor is formed of the N+ type emitter layer 24 serving as an emitter, the P+ type base layer 18 serving as a base, and that portion of the first high resistivity semiconductor layer 12 located directly under the base layer 18 and the semiconductor substrate 10 serving as a collector; a power semiconductor diode is respectively formed of the N+ and N− type cathode layers 26 and 22 serving as a cathode and the P+ type anode wall 20 and the P+ type buried anode layer 14 serving as an anode.

In the arrangement of FIG. 1, the power transistor has a withstanding voltage and a dielectric strength as determined by the thickness of an N− type collector layer which is substantially determined by the thickness of the first N− type high resistivity semiconductor layer 12, whereas the power diode has a withstanding voltage and a dielectric strength as determined by the thickness of the N− type cathode layer 22 which is substantially determined by the thickness of the second N− type high resistivity semiconductor layer 16. However, since the N− type cathode layer 22 is thinner than the N− type collector, the punch-through effect is apt to occur in the power diode and the resulting punch-through voltage determines the withstanding voltage of the power diode. Therefore, the power diode has been low in both its withstanding voltage and its dielectric strength.

In order to increase the withstanding voltage and dielectric strength of the power diode, the second N− type high resistivity semiconductor layer 16 and therefore the N− type cathode layer 22 may be increased in thickness. This has resulted in an unnecessary increase in crystal defects in the second N− type high resistivity semiconductor layer 16 and accordingly in the deterioration of the characteristics of the power transistor and diode.

Also, if the second N− type high resistivity semiconductor layer 16 is increased in thickness, then the power transistor has a body collector resistance which is higher than the required magnitude. This has resulted in a hindrance to the characteristics of the power transistor.

Referring now to FIG. 2 wherein like reference numerals designate the components identical or similar to those shown in FIG. 1, there is illustrated one embodiment according to the semiconductor device of the present invention. The illustrated arrangement is different from that shown in FIG. 1 only in that in FIG. 2, the P+ type buried anode layer 14 is disposed on the N+ type semiconductor substrate 10 and the P+ type anode wall extends through the first and second N− type high resistivity semiconductor layers to reach the P+ type buried anode layer.

The illustrated arrangement is produced by first disposing the P+ type buried anode layer 14 at a predetermined position on the surface of the N+ type semiconductor substrate 10 and then disposing the first N− type high resistivity semiconductor layer 12 on the entire surface of the semiconductor substrate 10 including the P+ type buried anode layer 14. Thus, the P+ type buried anode layer 14 is at a predetermined position on the boundary between the N+ type semiconductor substrate 10 and the first N− type high resistivity semiconductor layer 12. Subsequently, a first P$^{30}$ type anode wall 20a in the form of the annulus is disposed to extend through the first N− type high resistivity semiconductor layer 12 from the surface thereof remote from the semiconductor substrate 10 and reach the peripheral portion of the P+ type buried anode layer 14, and the second N− type high resistivity semiconductor layer 16 is disposed on the entire surface of the first N− type high resistivity semiconductor layer 12 including the first P+ type anode wall 20a.

Following this, the P+ type base layer 18 and a second P+ type anode wall 20b are disposed in the second N− type high resistivity semiconductor layer 16 in the same manner as described above in conjunction with FIG. 1. As shown in FIG. 2, the second anode wall 20b is aligned with the first anode wall 20a in the direction of thickness of the first and second semiconductor layers 12 and 16 and connected to the latter. Then, the N+ type emitter layer 24 and the N+ type cathode layer 26 are selectively disposed on the surface of the P+ type base layer 18 and of the diode portion 22 encircled by the second P+ type anode wall 20b as described above in conjunction with FIG. 1 whereupon the arrangement is completed.

In the arrangement of FIG. 2, the resulting power transistor is identical in structure to that shown in FIG. 1 and includes the N− type collector layer whose thickness is determined only by the thickness of the first N− type high resistivity semiconductor layer 12. However, the power diode includes the N− type cathode layer 22 whose thickness is substantially determined by the thickness of the first and second N− type high resistivity semiconductor layers 12 and 16. Therefore, the N− type cathode layer 22 can be thicker than the N− type collector layer. Accordingly, by setting the thickness of the first N− type high resistivity semiconductor layer 12 to a magnitude at which the punch-through effect does not occur therein, the power diode can have the withstanding voltage and dielectric strength equal to or higher than that of the power transistor without the occurrence of the punch-through effect on the power diode.

Also, in order to increase the withstanding voltage of the power diode, the first and second N− type high resistivity semiconductor layers 12 and 16 are not required to be particularly thickened. This prevents an increase in crystal defects due to this thickening.

As described above, the power transistor shown in FIG. 2 is identical in structure to that illustrated in FIG. 1 and therefore it is not hindered in various characteristics.

From the foregoing it is seen that the present invention provides a semiconductor device comprising a power transistor and a power semiconductor diode which are disposed on a common semiconductor substrate and which are high in both their withstanding voltage and dielectric strength. Therefore, the present invention is particularly effective for use with equipment supplied with high surge voltages.

While the present invention has been illustrated and described in conjunction with a single preferred embodiment thereof, it is to be understood that numerous changes and modifications may be resorted to without departing from the spirit and scope of the present invention. For example, all the semiconductor components may have the conductivity type reversed from that illustrated.

What is claimed is:

1. A semiconductor device comprising: a low resistivity semiconductor substrate of a first type of conductivity; a first high resistivity semiconductor layer of said first type of conductivity which is disposed on an entire surface of said semiconductor substrate; a buried low resistivity anode layer of a second type of conductivity which is disposed on a predetermined portion of a boundary between said semiconductor substrate and said first high resistivity semiconductor layer; a first anode wall in the form of an annulus extending through said first high resistivity semiconductor layer from a surface thereof which is remote from said semiconductor substrate and reaching a peripheral portion of said buried anode layer, said first anode wall being of said second type of conductivity and having a low resistivity; a second high resistivity semiconductor layer of said first type of conductivity which is disposed on an entire surface of said first high resistivity semiconductor layer including said first anode wall; a second anode wall in the form of an annulus extending through said second high resistivity semiconductor layer from a surface thereof which is remote from said first high resistivity semiconductor layer and reaching said first anode wall, said second anode wall being of said second type of conductivity and having a low resistivity; a low resistivity base layer of said second type of conductivity which is selectively disposed on an exposed surface of said second high resistivity semiconductor layer and reaching said first high resistivity semiconductor layer at a position which is located outside of said annulus of said second anode wall on said second high resistivity semiconductor layer so as to be spaced therefrom; a low resistivity cathode layer of said first type of conductivity which is selectively disposed on an exposed surface of a portion of said second high resistivity semiconductor layer which is encircled by said second anode wall; and a low resistivity emitter layer of said first type of conductivity which is selectively disposed on a surface of said base layer; wherein a power transistor is formed with said emitter layer as an emitter, said base layer used as a base and both a portion of said first high resistivity semiconductor layer located directly under said base layer and said semiconductor substrate used as a collector and wherein a power semiconductor diode is formed with said buried anode layer and said first and second anode walls used as an anode and said low resistivity cathode layer and portions of said first and second high resistivity semiconductor layers which are respectively encircled by said first and second anode walls used as a cathode and wherein said second high resistivity layer of said first type of conductivity is thicker than said first high resistivity semiconductor layer of said first type of conductivity.

* * * * *